United States Patent [19]

Hart

[11] 4,074,192

[45] Feb. 14, 1978

[54] KEYLESS UNIDIRECTIONAL RESET FOR CUMULATIVE DEMAND REGISTER

[75] Inventor: David Gerald Hart, Clemson, S.C.

[73] Assignee: Sangamo Electric Company, Springfield, Ill.

[21] Appl. No.: 690,726

[22] Filed: May 27, 1976

[51] Int. Cl.$^2$ .................. G01R 11/02; G05G 5/16; G06C 15/42

[52] U.S. Cl. .................. 324/103 R; 74/531; 188/82.6; 188/77 W; 235/144 MA

[58] Field of Search .................. 188/82.6, 77 W; 324/103 R; 235/144 MA, 144 SP; 74/531

[56] References Cited

U.S. PATENT DOCUMENTS

| 2,087,987 | 7/1937 | Nein | 235/144 MA |
|---|---|---|---|
| 2,123,943 | 7/1938 | Hamill | 235/144 MA |
| 2,123,944 | 7/1938 | Hamill | 235/144 MA |
| 2,173,126 | 9/1939 | Moore | 188/82.6 X |
| 2,220,599 | 11/1940 | Galter | 188/82.6 X |
| 2,518,701 | 8/1950 | Luenberger | 188/82.6 X |
| 2,961,217 | 11/1960 | Sacchini | 188/82.6 X |
| 3,064,766 | 11/1962 | Hanizeski | 188/82.6 X |
| 3,837,441 | 9/1974 | Uno et al. | 188/82.6 |
| 3,908,166 | 9/1975 | Shackford | 235/144 MA |

Primary Examiner—Irwin C. Cohen
Attorney, Agent, or Firm—Emrich, Root, O'Keefe & Lee

[57] ABSTRACT

A manual mechanism for resetting a rotatable member to its initial position is disclosed which provides for rotation of 360° or more, rotates in one direction only, and can be simply locked and unlocked for periodic use. In one embodiment the resetting mechanism is applied to cumulative demand registers on watt hour meters.

5 Claims, 6 Drawing Figures

U.S. Patent  Feb. 14, 1978  4,074,192
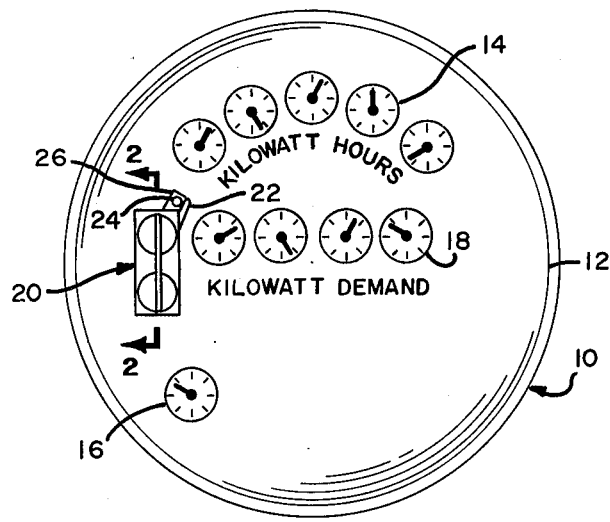
FIG. 1
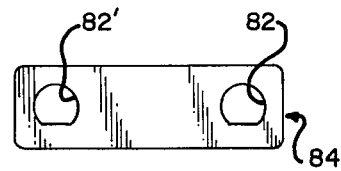
FIG. 6
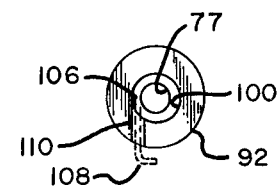
FIG. 4
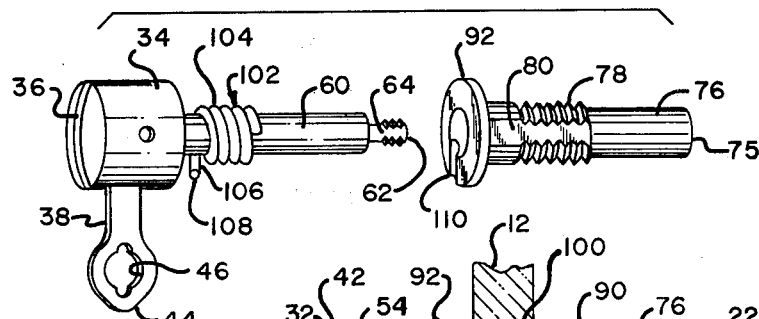
FIG. 3
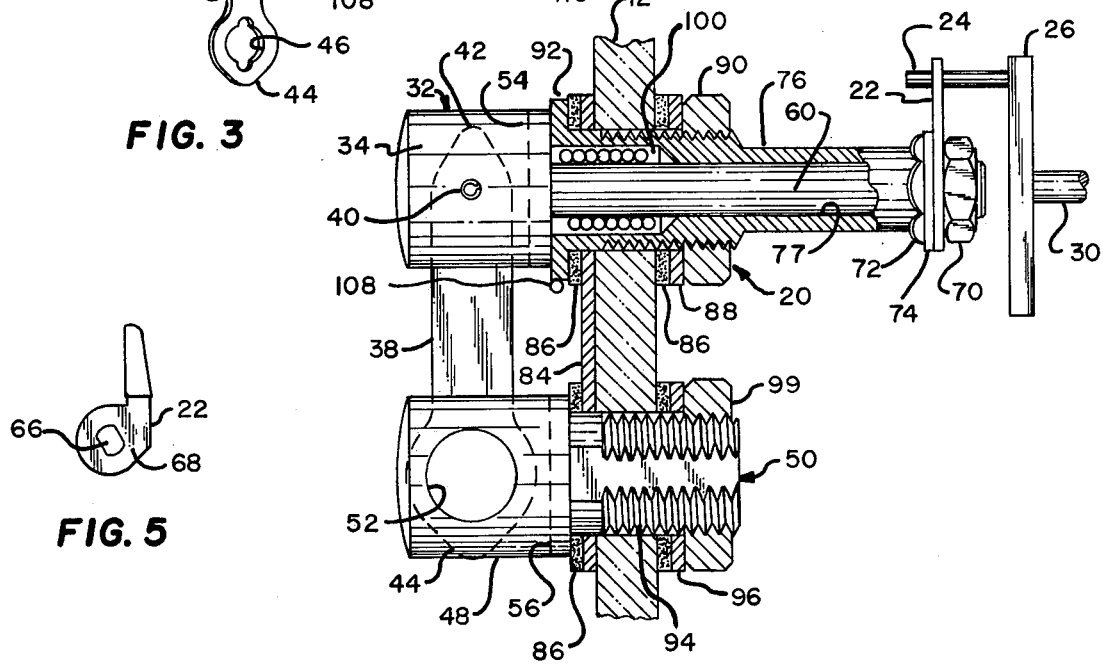
FIG. 5
FIG. 2

KEYLESS UNIDIRECTIONAL RESET FOR CUMULATIVE DEMAND REGISTER

BACKGROUND OF THE INVENTION

A demand register on a watt hour meter indicates the maximum load that has been connected to the circuit since the last reading and resetting of the meter. The demand register contains a pusher arm or pusher wheel that is driven by the power measuring mechanism of the watt hour meter. The arm or wheel is periodically reset by a timing device, such as an electric clock mechanism, so that the maximum position of the arm or wheel at any time indicates the kilowatt demand during the particular interval, usually 15, 30, or 60 minutes, at which the observation is made. The demand pointer or demand wheel, driven by the pusher arm or wheel, is not restored to its initial position by the timing device but remains in the highest position to which it has been moved since the last reset by the meter reader.

At the time of reading, the position of the demand pointer or wheel is noted and the customer billed accordingly. A penalty may be imposed if the demand exceeds a predetermined amount. The maximum demand pointer or wheel is then reset for operation during the next billing period, usually one month.

Demand registers can be one of three different types. These are referred to in AEIC/EEI/NEMA Standard MSJ-4 as Single pointer Form Registers, Multiple Pointer Form Registers, and Cumulative Form Registers. The demand pointer on a Single Pointer Form Register is pushed through an arc of less than 360° by its pusher arm, and the monthly reset thus requires less than 360° rotation in order to return the demand pointer to zero.

A multiple Pointer Form Demand Register provides for more than 360° rotation of the demand wheel and gears one or more additional demand wheels with a step-down of 10, 100, etc. This allows reading of the maximum demand on circles identical to those normally provided for reading the kilowatt hour usage. The monthly reset mechanism must also be bi-directional or provided with a slipping clutch so that a crank mechanism can return the multiple pointers to zero against a positive stop. The crank also rotates less than 360° as in Ham Pat. No. 3,721,901 or Shackford 3,908,166.

A cumulative Form of Demand Register has a special purpose as will be explained later, and the actual demand is not recorded until after the monthly resetting operation has transferred the reading of a hidden demand wheel to a set of multiple pointer displays. The monthly reset mechanism for a Cumulative Form Demand Register must rotate a full 360° or more so that no back-up of the mechanism is required in order to be ready for the following month.

Back-up must be prevented because of the purpose of a Cumulative Demand Register is to prevent possible collusion between the meter reader and the electricity customer. A weakness of the Single Pointer Form or Multiple Pointer Form Registers is the fact that the demand reading is destroyed at the time of monthly reset, and there is no audit means for determining if the meter reader reported the correct value. However, the reported demand reading from a Cumulative Form Demand Register can be audited any time prior to the next month's reset.

The 360° or more motion is necessary so that the meter reader cannot partially reset the demand one month, back-up the reset mechanism and reseal, and then reset another portion of the demand the following month. Two or more such partial monthly resets would permit reporting of low demand readings that could not be detected by any intermediate audits.

Therefore, Cumulative Form Demand Registers have historically been provided with 360° or more rotation unidirectional mechanisms such as a key-lock that must be rotated 360° in one direction only before the key can be removed, or by a motorized mechanism where a push button starts a motor that cannot be interrupted, or by a spring-wound mechanism that must be cocked and triggered to prevent interruption of a complete revolution.

SUMMARY OF THE INVENTION

This invention provides a manual resetting mechanism for a Cumulative Demand Register that is capable of 360° or more of rotation, provides uni-directional rotation only, is simple and efficient in operation, can be readily re-sealed each month, and economically manufactured.

DESCRIPTION OF THE DRAWINGS

For a more complete understanding of the nature and scope of this invention, reference may be had to the following detailed description taken in connection with the accompanying drawings in which:

FIG. 1 is a front plan view of a combination electric demand meter and watt hour meter, illustrating a multiple dial demand register with the uni-directional demand reset attached to and through the cover glass;

FIG. 2 is a fragmentary partial cross-sectional view taken along the line 2-2 of FIG. 1 and showing the in-put shaft and actuating crank for the kilowatt demand register;

FIG. 3 is an exploded perspective view of the sealing link post and bushing to expose the clutch spring;

FIG. 4 is a plan view of the end of the bushing shown in FIGS. 2 and 3;

FIG. 5 is a plan view of the operating arm; and

FIG. 6 is a plan view of the reinforcing plate.

DESCRIPTION OF THE PREFERRED EMBODIMENT

Referring to FIG. 1 there is shown the face of the cumulative demand register 10 of a watt hour meter having a glass cover 12 fitted over the face plate thereof upon which appear the digital dials 14 to register the electrical consumption and including the test dial 16 and displaying the four digital kilowatt demand dials 18 in a central position.

The manual reset device 20 of this invention attaches to the glass cover 12 in such a manner that the operating arm 22 of the reset device 20 is in the plane of the pin 24 of the reset crank 26 on a shaft 30 which extends forwardly of the face of the cumulative demand register 18. The register 10 can be any of several known types and since the construction and functions are well known in this art, no further description is necessary. The only requirement is that such a meter include an input shaft for the cumulative demand register which is rotatable in one direction during the reset operation.

Referring to FIG. 2 the manual reset device 20 is shown with its operating arm 22 in operable relationship with the pin 24 of the reset crank 26 that is affixed to the input shaft 30 of the cumulative demand register 18 and for purposes to be described.

Referring to FIGS. 2 and 3, the manual reset 20 includes the sealing link post 32 having an enlarged round head portion 34 which bears the open-ended slot 36 extending part way therethrough and forming a housing for the sealing link 38. The spring pin 40 is press-fitted through one-half of the bifurcated head portion 34 to engage across the slot 36 through a closefitting bore hole in the tapered end 42 of the sealing link 38.

The other end 44 of the sealing link 38 is provided with an enlarged bore hole 46. The sealing link 38 is flat and swings downwardly (depending on the position of the meter) so that its end 44 passes into a similar slot in the head 48 of the sealing post 50. The transverse bore hole 52 in the sealing post head 48 extends through the bifurcations and registers with the bore hole 46 so as to receive a lock or ribbon seal in a manner known in this art. The depth of the slot 36 in the head 32 is represented by the broken line 54 while the depth of the slot in the head 48 is shown by the broken line 56. It is apparent from this description that the sealing link 38, upon being unlocked from the sealing post 50, can be pivoted less that 90 degrees on the pin 40 so that the end 44 clears the head 48 in which position the tapered end 42 impinges on the bottom 54 of the slot 36. By these means, the sealing link 38 cannot be pivoted to a 180 degree position in the slot 36 and used for imparting a half revolution to the head 32. Other means to limit the rotation of the sealing link 38 to less than 180 degrees can be used such as a protuberance, a second spring pin or an enclosing wall in the top part of the slot 36, which constructions are not illustrated.

With the manual reset device 20 mounted through the glass cover 12 in the manner shown in FIG. 2, upon unlocking the sealing link 38 from the sealing post 50, it can thus be pivoted slightly to clear the slot therein and used as a lever to rotate the sealing link post 32 and rotate the operating arm 22 in one direction to impinge against the pin 24 and impart a reset connection to the input shaft 30.

Accordingly, the parts are constructed so that the assembly is rigidly affixed to the glass cover and the only movable parts are those accomplishing the aforesaid purpose without backlash or play in the connections.

Thus, the device includes the round shaft or shank 60 as an integral part of the sealing link post 32. The shank 60 extends into a plane intersecting with the axis of the pin 24. The shank 60 has the threaded end portion 62 of reduced diameter and having an essentially square or rectangular cross-section formed by two opposite flat sides. One of the flat sides is shown at 64. The operating arm 22 (See FIG. 5) has the corresponding rectangular hole 66 in its body 68 which fits on the end portion 62 with little or no play in a fixed position for positive rotation therewith.

The operating arm 22 is fastened to this end of the shank 60 by means of the nut 70, and any axial play is limited by means of the spring washer 72 and the associated common washer 74 which abut against the end 75 of the bushing 76. The shank 60 of the sealing link post 32 is rotatably mounted within the central bore 77 of the bushing 76.

The bushing 76 includes the threaded portion 78 of somewhat larger diameter which can be essentially square in cross-section, or include a flat side as shown at 80. This part of the bushing extends through a suitable bore hole in the glass cover 12 and also fits relatively tightly within the square or corresponding hole 82 of the symmetrical reinforcing plate 84 (See FIG. 6). Suitable fiber washers 86 are positioned adjacent each side of the glass to limit the metal-to-glass contact and to also provide a waterseal. The common washers 88 are placed on the outside of the fiber washers and the nut 90 engages the threads 78 to hold the assembly against the glass through the flange 92. The outer surface of the flange 92 is a bearing surface for the rotating head 34 of the sealing link post 32.

The sealing post 50, already described, has its threaded shank portion 94 similarly affixed through a second bore hole in the glass 12, for which purpose the shank 94 can have one or more flat sides (as illustrated) that are adapted to mate within a second hole 82' in the reinforcing link 84. The lower assembly is affixed to the glass by means of a second pair of fiber washers 86, the common washer 98 and hex nut 99 so that its slotted head 48 remains in the plane of the sealing link 38.

The bore hole 77 of the bushing 76 is counter-bored at 100 to a larger diameter than the shaft 60 to provide a cylindrical recess for the clutch spring 102. The convolutions 104 of the clutch spring 102 are wound tightly around the shank 60 and one bight portion or extension 106 of the spring extends tangentially therefrom to the outer periphery of the flange 92 where it defines an offset or tab end 108 bent in essentially the same plane as the convolutions. The extension 106 of the spring 104 engages within the slot 110 in the outer face of the flange 92. The depth of the slot 110 is about the same as or greater than the diameter of the extension 106.

The slot 110 extends substantially tangential of the recess 100 and the bight portion 106 of the clutch spring 102 extends to the periphery of the flange so that the tab end 108 engages from the slot over the periphery of the flange as shown in broken lines in FIG. 4.

It is to be observed that when the device is assembled as shown in FIG. 2 the flange 92 is held flush against the inner face of the head 34 so that the slot 110 is effectively enclosed about the extension 106.

Considering that the spring 102, as shown in FIG. 3 and viewed axially from the left, is wound counter-clockwise around the shank 60, and, the flange 92 (See FIG. 4) as well as the extension 106 are stationary; if the unlocked sealing link 38 is rotated clock-wise along with the shank 60, the convolutions 104 of the spring are tightened upon the shaft. However, if the unlocked sealing link 38 is rotated counter-clockwise, the stopping force of the slot 110 will tend to open the convolutions 104 and allow such movement, though with a degree of frictional drag.

From this description it is apparent that the spring 102 is mounted in such a manner that it prevents rotation between the shaft 60 and the bushing 76 in a direction that tightens the convolutions 104 of the spring 102. The circumferential space 100 around the spring 102 provides sufficient clearance around the outside diameter of the convolutions to allow expansion and easy rotation when the shaft 60 is rotated in the proper direction. Reversal of these parts and the slot 110 will of course allow rotation in the opposite direction.

In the event the sealing link 38 is rotated less than 360 degrees it cannot be re-locked in the sealing post 50. If the sealing link is rotated more than 360 degrees through inadvertence, it cannot be reversed and must be rotated again in the same direction back to a point of registery with the slot in the sealing post head 48. Additional revolutions of the register crank 26 do not record any additional demand or damage the register.

An additional requirement for the uni-directional motion of shaft 60 is to prevent damage to a Cumulative Demand Register 10. Such registers are not designed to accept reverse motion of their reset cranks such as 26, and damage could occur unless a uni-directional reset mechanism was utilized.

The simple mechanism illustrated and described herein does not require an expensive lock and key arrangement utilized on other Cumulative Demand Register meters. Such locks are expensive, and possible loss of a key could greatly inconvenience the meter reader. It could be said that the sealing of link 38 to post 48 cannot be guaranteed and therefore a key-lock mechanism is more secure since the key must be rotated 360 degrees in order to remove it and use the key on the next meter. However, keys can be duplicated, and a duplicate key could be left in a key-lock reset mechanism just as easily as the instant device could be left unsealed. An audit inspection between the monthly reading periods would detect an unsealed handle as well as the presence of a duplicate key.

The advantage of the described invention over a motorized mechanism, in addition to simplicity and lower cost, is a faster reset time for the meter reader. Motorized reset mechanisms must drive very slowly in order to utilize a small motor, and the meter reader must wait 30 seconds or more at each meter before he can record the demand reading. A manual reset using the device of this invention would easily save 20 seconds per meter including the time to reseal the reset mechanism. Since a meter reader might be expected to read at least 100 demand meters per work day, or one meter every 4 minutes, a savings of 20 seconds per meter is significant.

What is claimed is:

1. A reset mechanism mountable in and through an aperture in the cover of an electric watt hour meter, said meter having a crank-operated cumulative demand register comprising:

an elongated, tubular bushing member;

a shaft member having a head end and a shank member extending through and rotatably supported by said bushing member;

said bushing member having a radial flange and an intermediate shank portion extendable through said aperture in said cover;

means engageable with said shank portion of said bushing member and the inside of said cover to secure said bushing member within said aperture with said flange member against the outside of said cover member;

said bushing member having a counterbore defining an annular space extending from its flanged end and encompassing a portion of said shank member of said shaft;

said flange having a radial slot in its outer surface communicating with said annular space;

a radial slot in the head end of said shaft;

a link member pivotally mounted at one end in said slot of said head end for rotation thereabout through an angle of less than 180°;

a locking post carried by said cover and spaced from said shaft member;

a radial slot in the locking post oriented to be in the plane of the radial slot of said head member in one position thereof and adapted to receive the other end of said link member in a locked position;

a coil spring around the portion of said shank member of said shaft having its convolutions within said annular space with a bight end of said coil spring extending into said radial slot in said flange member;

said convolutions of said spring being in bearing contact with said shank member within said annular space whereby said shaft member is rotatable in an angular direction opening said convolutions about said shank member and is prevented from rotation in the opposite direction;

resilient means at the extended end of said shank member retaining said head end in axially thrust relationship with said flange of said bushing member and retaining the bight end of said coil spring in said radial slot; and an operating lever on the inner end of said shank member for operable engagement with said crank-operated cumulative demand register whereby in the unlocked position said link member is pivotable from the slot of said locking post to an angular position with the axis of said shaft member to serve as a lever to rotate said shaft and said operating lever in said angular direction to a point of re-registry with said slot in said locking post.

2. A reset mechanism in accordance with claim 1 in which:

said radial slot in said flange of said bushing member extends substantially tangentially from said counterbore to the periphery of said flange.

3. A reset mechanism in accordance with claim 1 including:

means to mount said bushing member and said sealing post in non-rotatable substantially parallel spaced relationship a fixed distance from each other in said cover with said operating arm rotatably engageable with said crank-operated cumulative demand register; and a reinforcing plate connected between said bushing member and said locking post, said reinforcing plate having apertures at its ends that engage said bushing member and said locking post in fixed non-rotatable relationship.

4. A uni-directional, rotatable, remote control mechanism for use through a dividing wall, comprising:

a tubular bushing member adapted to be mounted in fixed relationship through the dividing wall;

a shaft member having a head end with a shank member rotatably supported by said bushing member;

said bushing member having a counterbore defining an annular space about a portion of said shank member and a flange at one end with an outer planar face intersecting said annular space;

a slot in said planar face of said flange and extending from and communicating with said annular space;

a coil spring around said shaft member having its convolutions within said annular space with a bight end of said coil spring affixed by said slot in the flange of said bushing;

means retaining said shaft in axially thrust relationship with said head end against said flange of said bushing and retaining the bight end of said coil spring in said radial slot;

said convolutions of said spring being in bearing contact with said shaft member and spaced from said bushing member within said annular space whereby said shaft member is rotatable in an angular direction which opens said convolutions about said shaft and is prevented from rotation in the opposite direction.

5. A uni-directional mechanism in accordance with claim 1 including:

manual means to rotate said shaft member from one side of the dividing wall and an operating arm on the opposite end of said shaft member under remote uni-directional rotating control thereby.

* * * * *